(12) United States Patent
Kondo et al.

(10) Patent No.: US 6,294,722 B1
(45) Date of Patent: Sep. 25, 2001

(54) INTEGRATED THIN-FILM SOLAR BATTERY

(75) Inventors: Masataka Kondo, Kobe; Takayuki Suzuki, Otsu, both of (JP)

(73) Assignee: Kaneka Corporation, Osaka (JP)

( * ) Notice: Subject to any disclaimer, the term of this patent is extended or adjusted under 35 U.S.C. 154(b) by 0 days.

(21) Appl. No.: 09/510,842

(22) Filed: Feb. 23, 2000

(30) Foreign Application Priority Data

| Feb. 25, 1999 | (JP) | 11-048387 |
| Jul. 15, 1999 | (JP) | 11-201338 |
| Aug. 12, 1999 | (JP) | 11-228524 |

(51) Int. Cl.⁷ .................................. H01L 31/042
(52) U.S. Cl. ............... 136/244; 136/251; 136/258; 136/261; 257/466
(58) Field of Search .................. 136/244, 251, 136/258, 261; 257/466

(56) References Cited

U.S. PATENT DOCUMENTS

| 4,507,519 | * | 3/1985 | Kazumi et al. ................. 136/258 |
| 4,543,441 | * | 9/1985 | Kumada et al. ................. 136/249 |
| 4,663,494 | * | 5/1987 | Kishi et al. ...................... 136/244 |
| 4,879,251 | * | 11/1989 | Kruehler et al. ................ 136/244 |

FOREIGN PATENT DOCUMENTS 11026787    1/1999   (JP) .

* cited by examiner

*Primary Examiner*—Alan Diamond
(74) *Attorney, Agent, or Firm*—Hogan & Hartson LLP.

(57) ABSTRACT

A sputtering-deposition method usable in forming on an insulator substrate a film including a conductive layer includes the steps of: preparing a conductive substrate holder in the form of a frame having an opening at its central area and electrically grounded; positioning the insulator substrate to cover the opening of the holder; arranging a flexible spacer on a peripheral edge of the substrate and also superposing a back plate on the spacer to press the substrate against the holder via the spacer; pressing and fixing the back plate to the holder; and then sputtering a separately provided target to deposit a new layer on a region of the substrate exposed in the holder's opening.

5 Claims, 3 Drawing Sheets

INTEGRATED THIN-FILM SOLAR BATTERY

BACKGROUND OF THE INVENTION

1. Field of the Invention

The present invention relates to thin-film photoelectric conversion devices and sputtering-deposition methods usable in manufacturing the same, and in particular to a back metal electrode layer of a thin-film photoelectric conversion device that is formed on a transparent insulator substrate and to a sputtering-deposition method usable in forming the layer.

2. Description of the Background Art

Thin-film solar batteries, TFT (Thin-Film Transistor) arrays, mirrors and the like require that a film including at least one conductive layer be formed on an insulator substrate.

FIG. 1 is a schematic cross section showing an exemplary conventional sputtering-deposition method used to form on an insulator substrate film including at least one conductive layer. In this sputtering-deposition method, a substrate holder 1 is initially prepared. Substrate holder 1 is generally in the form of a frame with an opening 1a at its central area. Substrate holder 1 preferably has along a peripheral edge of opening, 1a a step 1b for accepting substrate 2. Furthermore, substrate holder 1 is formed of a conductive material such as stainless steel and electrically grounded.

On conductive substrate holder 1, an insulator substrate 2 such as a glass plate is positioned to be fit on step 1b to cover opening 1a. Superposed on insulator substrate 2 is a back plate 3 formed of a conductive plate, such as an aluminum plate or a carbon plate. Back plate 3 is fixed to holder 1 with a screw or bolt 4 to press insulator substrate 2 against conductive holder 1.

In such condition, metal, oxide, nitride or the like is sputtered to deposit a layer thereof on a region of insulator substrate 2 exposed in the holder's opening 1a. In such film deposition through sputtering, Ar ions used in general to sputter a target and sputtered particles to contribute to the film deposition are positively charged. As such, when a conductive layer of metal, transparent conductive oxide (TCO) or the like is formed on insulator substrate 2, when an additional conductive layer of metal, TCO or the like is formed on a surface of a layered structure including at least one conductive layer already formed on insulator substrate 2, as in a case of forming a back electrode to fabricate a thin-film solar battery with a transparent electrode, a semiconductor layer and the back electrode successively formed on a transparent insulator substrate of glass or the like, or when a layer of a metal such as Cr (a conductive layer) is initially formed on transparent insulator substrate 2 such as a glass plate and then an insulating layer is formed on the metal layer, as in a case of forming a gate insulating film of a TFT, the positive charge of Ar ions and sputtered particles flying toward and colliding against insulator substrate 2 is transferred to the conductive layer on the substrate. To release the electric charge transferred to the conductive layer on insulator substrate 2, conductive substrate holder 1 is earthed.

If substrate 2 is electrically floating from conductive holder 1, however, the electric charge from Ar ions and sputtered particles is accumulated in the conductive layer on insulator substrate 2 and voltage of the conductive layer is increased, and when the voltage of the conductive layer exceeds a certain value, the layer discharges as if a thunder were caused. The discharge occurs between the conductive layer on substrate 2 and the target or other portions of the sputtering apparatus, and such portions suffer damage traces due to the discharge. As a result, the film on substrate 2 is severely damaged and the whole substrate must be discarded.

In particular, for an integrated thin-film solar battery, a back electrode is formed through deposition at an almost final step of the whole process, i.e., after forming a transparent electrode layer on a glass substrate, patterning the transparent electrode layer, forming a semiconductor layer such as a thin film of amorphous silicon, crystalline silicon or the like, and patterning the semiconductor layer. As such, the discharge damage of the back electrode leads to economically severe damage and it is a matter of concern.

With the recent heightened public awareness of protection of global environment, solar power generation is increasingly used as a clean energy source. Solar battery modules are often installed on roofs and walls of buildings and in such case they play a role as parts of the buildings. As such, architects demand a solar battery module having an appearance harmonious with the building of interest, in particular that having a color tone harmonious with the building. As such, for example a thin-film solar battery module with a continuous browny color across the entire surface of a transparent insulator substrate such as a glass plate, is preferable to a monocrystilline-type solar battery module including a plurality of mutually discontinuous monocrystalline cells joined to a glass substrate.

In general, a thin-film solar battery module is fabricated by successively stacking a transparent electrode layer, a semiconductor layer and a metal electrode layer on a transparent insulator substrate through vapor-phase deposition. In stacking the layers, normally the region for forming the semiconductor layer and that for forming the metal electrode layer are set to be substantially identical. As such, if an actually deposited metal electrode layer has a peripheral edge region positionally offset and thus protruding from a peripheral edge of the semiconductor layer, then as seen from a light-incident side of the transparent substrate the peripheral edge region of the metal electrode layer can be disadvantageously observed in the form of a white line showing outside the dark browny peripheral edge of the semiconductor layer region to spoil a unified good appearance of the thin-film solar battery module.

Furthermore for a monocrystalline-type solar battery module a sealing resin material of white color or similar colors is normally used to protect back surfaces of a plurality of monocrystalline cells of the module and if such material is applied to protect a back surface of a thin-film solar battery module then the module has an appearance with its semiconductor layer region's peripheral edge surrounded by a white frame and thus has an aesthetically degraded appearance.

In a thin-film solar battery module, in general a transparent electrode layer, a semiconductor layer and a metal electrode layer stacked on a substrate are for example laser-described and thus divided into a plurality of photoelectric conversion cells which are in turn electrically interconnected and thus integrated. An industrial standard of thin-film solar battery modules requires that a cell region be insulated from any peripheral edge region outside the cell region, and accordingly a thin-film solar battery module typically has a cell region laser-scribed and thus electrically isolated from any peripheral edge region that may electrically contact a frame holding the module. As such, if the semiconductor region deposited on the transparent insulator substrate is inward of a peripheral edge of the metal electrode layer deposited on the semiconductor region and at a location for forming the aforementioned peripheral isolation groove the metal electrode layer directly contact the transparent electrode layer or the transparent insulator substrate, then a laser beam incident on and transmitted through the transparent substrate to laser-scribe the metal electrode layer can hardly form a satisfactory such groove in the metal layer due to its high reflectance and thus often fails to provide a sufficient withstand voltage.

A thin-film solar battery module typically has a back electrode covered with an organic protection film with a sealing resin layer therebetwen to prevent its back metal layer from deteriorating while the module is used outdoor and also to prevent its power generation performance from temporarily lowering when rain droplets, dews and the like adhere between the photoelectric conversion cells of the module.

A thin-film solar battery module has a back electrode layer formed of a highly reflective metal material to more efficiently use incident light in its semiconductor layer for photoelectric conversion. More specifically, light which is not absorbed in the semiconductor layer and is thus transmitted therethrough can be reflected by the highly reflective back metal layer back into the semiconductor layer and the reflected light can also be absorbed in the semiconductor layer and thus photoelectrically converted to provide an improve photoelectric conversion efficiency of the thin-film solar battery module. The back electrode layer is often formed of silver or a silver alloy in view of light reflectance and conductivity. Silver, however, readily deteriorates when it is exposed to the atmosphere, since it reacts with a sulfur-containing gaseous component such as $SO_x$ contained in the atmosphere and on its surface a silver sulfide is produced. Such degrading reaction proceeds with time and can reach inside the back electrode layer. As such, if a thin-film solar battery module is used outdoor over a long time period, its back electrode layer, even protected with organic film, deteriorates as described above. This can result in a degraded adherence between the back electrode layer and the organic film and hence peeling of the protection film and a reduced conductivity of the back electrode layer.

According to a recent study by the present inventors, it has been found that a back electrode layer can react with a sulfur component in the atmosphere and thus be degraded significantly not only while a thin-film solar battery module including the back electrode layer is used outdoor but while the module is fabricated. More specifically, if even for a short time period between formation of the back electrode layer and application of a sealing resin and an organic protection film the silver-containing back electrode layer is directly exposed to the atmosphere, then the layer's surface immediately reacts with the sulfur component in the atmosphere. Needless to say, the reaction degrading the back electrode layer can proceed deeper inside the back electrode layer if the layer is longer exposed to the atmosphere.

SUMMARY OF THE INVENTION

In view of the aforementioned related art, one object of the present invention is to provide a sputtering-deposition method capable of preventing a conducive layer from being charged up and thus discharging when a film including at least one such conductive layer is formed on an insulator substrates.

Another object of the present invention is to provide a solar battery module having a peripheral edge region with an improved appearance.

Still another object of the present invention is to provide an improve stability and reliability of a photoelectric conversion device having a silver-containing back electrode layer.

In one aspect of the present invention, a sputtering-deposition method employed to form on an insulator substrate a film including at least one layer of conductive material, includes the steps of: preparing a conductive substrate holder in the form of a frame having an opening at its central area and electrically grounded; positioning the substrate to cover the holder's opening; arranging a flexible spacer on a peripheral edge of the substrate, and also superposing a back plate for pressing the substrate against the holder via the spacer; pressing and fixing the back plate to the holder; and in this condition, sputtering a separately provided target to deposit a new layer on a region of the substrate exposed in the holder's opening.

It should be noted that the spacer may be previously arranged on and fixed to the back plate. Furthermore, the spacer can be formed of Teflon® or an aluminum foil.

In another aspect of the present invention, an integrated thin-film solar battery module includes a stacked-layered body comprised of a transparent electrode layer, a semiconductor layer and a metal electrode layer successively passively deposited on a transparent insulator substrate, and at least a part of the stacked-layered body is divided to form a plurality of photoelectric conversion cells which are in turn electrically interconnected, with the deposited metal electrode layer's region having a peripheral edge intruded by a predetermined short distance inward of any perimeter of the deposited semiconductor layer's region.

The plurality of photoelectric conversion cells can be formed in an area set writhing a region of the deposited metal electrode layer.

Furthermore, to protect the transparent electrode layer, the semiconductor layer and the metal electrode layer, there can be preferably applied a sealing resin filler or an organic, back protection film having a dark color selected from the group consisting of black, brown, and wine red. Furthermore, the semiconductor layer can preferably include silicon as a main component.

In still another aspect of the present invention, a thin-film photoelectric conversion cell includes a transparent electrode, a photoelectric conversion unit of semiconductor, and a silver-containing back electrode successively stacked on a transparent insulator substrate, with the back electrode having not only its upper surface but its side surface covered with an inorganic protection film containing one selected from the group consisting of a noble metal stable against the atmosphere and water, a base metal forming a passive-state film in the atmosphere, and an oxide stable against the atmosphere and water.

Preferably, the back electrode has a peripheral edge intruded by a predetermined short distance inward of a peripheral edge of the photoelectric conversion unit of semiconductor, with an inorganic protection film also covering the upper surface of the unit which is exposed outside the peripheral edge of the back electrode.

Preferably, the back electrode is formed substantially of silver in view of conductivity and light reflectance.

Furthermore, the inorganic protection film can include one selected from the group consisting of gold, platinum, aluminum, titanium, silicon oxide, aluminum oxide and zinc oxide and in particular it is preferably formed of titanium. Preferably on the inorganic protection film a sealing resin layer and an organic protection film are stacked successively.

The photoelectric conversion unit of semiconductor can include a photoelectric conversion layer formed of hydrogenated amorphous silicon or an alloy thereof, or a photoelectric conversion layer formed of crystalline silicon.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
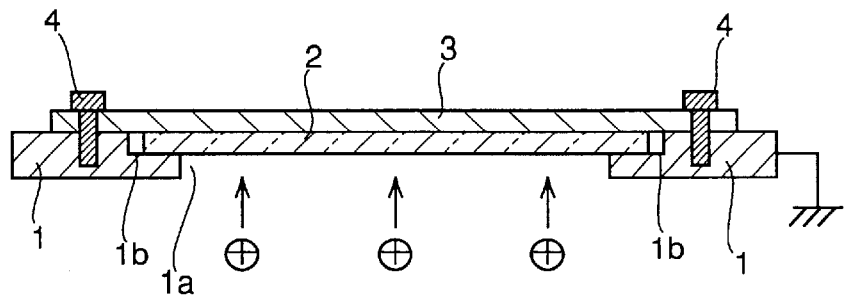
FIG. 1 is a schematic cross section showing a substrate holding structure in a conventional sputtering-deposition method.

First of all, the present inventors have found from the following facts that with the conventional sputtering-deposition method as shown in FIG. 1 it is difficult to completely prevent a conductive layer on insulator substrate 2 from being charged up and thus discharging.

As an initial experiment, assuming deposition of a back electrode for a thin-film solar battery, a glass substrate with a transparent electrode and a semiconductor layer stacked thereon was prepared and set on conductive holder 1 as shown in FIG. 1 and then subjected to sputtering to deposit a film thereon. In this experiment there were observed occasional discharging phenomena attributed to charging-up, though it was difficult to grasp the discharging phenomena in detail and it seemed that another experiment should be conducted using a simpler system. Accordingly, with only glass substrate 2 set similarly on the FIG. 1 conductive holder 1, a conductive layer was experimentally deposited and there were still such discharging phenomena occasionally observed. In this experiment there was no means to quantitatively measure electrical conduction of contact between the substrate and the holder and it was thus believed that such means was necessary.

Accordingly, the present inventors prepared glass substrate 2 having a TCO layer on the entirety of its lower surface and set substrate 2 on conductive holder 1, as shown in FIG. 1. Then, a tester was used to measure the electrical conduction between the TCO layer and holder 1 in the vicinity of a perimeter of the substrate's opening 1a and a resistance no more than 1 Ω was obtained.

However, discharge occurred when an Ag layer was deposited on the TCO layer through sputtering. On the other hand, glass substrate 2 was damaged when screw 4 was screwed too tightly to ensure contact between substrate 2 and conductive holder 1.

Figure 2:
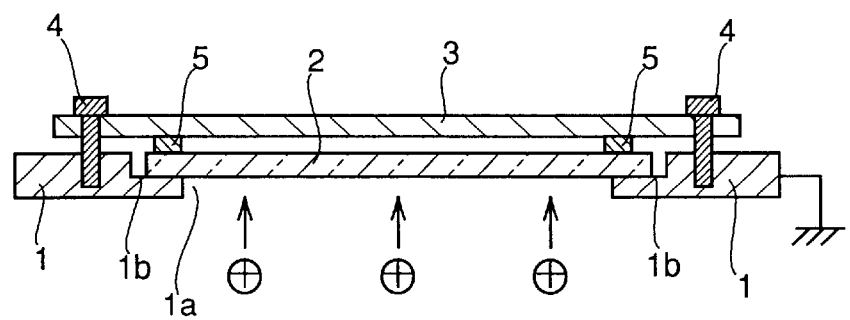
FIG. 2 is a schematic cross section showing a substrate holding structure in a sputtering-deposition method according to one embodiment of the present invention.

FIG. 2 is a schematic cross section showing a sputtering-deposition method according to an embodiment of the present invention. In this sputtering-deposition method also, substrate holder 1 is initially prepared as in the FIG. 1 conventional example. Substrate holder 1 is generally in the form of a frame with opening 1a at its central area. Furthermore, substrate holder 1 preferably has along a peripheral edge of opening 1a a step 1b for, accepting substrate 2. Furthermore, substrate holder 1 is formed of a conductive material such as stainless steel, and it is electrically earthed.

On such conductive substrate holder 1, insulator substrate 2 such as a glass plate is positioned to fit on step 1b to cover opening 1a.

In contrast with the conventional example, a spacer 5 formed of a flexible material such as Teflon® or an aluminum foil is arranged on a peripheral edge of insulator substrate 2. Spacer 5 can be sized, shaped and arranged, as appropriately selected.

Then, back plate 3 formed of a conductive plate such as an aluminum plate or a carbon plate is superposed on insulator substrate 2 with spacer 5 therebetween to cover the entirety of the back surface of insulator substrate 2. Back plate 3 is fixed to holder 1 with a screw or a bolt 4 such that back plate 3 presses insulator substrate 2 against conductive holder 1. It is needless to say, however, that the means to fix back plate 3 to holder 1 is not limited to the screw or the bolt and it may be other means, such as a clip or a clamp.

In the condition as shown in FIG. 2, metal, oxide, nitride or the like can be stuttered and a layer thereof can be deposited on a region of insulator substrate 2 which is exposed in the conductive holder's opening 1a. As such, when a conductive layer such as a metal layer or a TCO layer is formed on insulator substrate 2 or when at least one conductive layer is initially formed on insulator substrate 2 and an insulator layer is then deposited on the conducive layer, the conductive layer on insulator substrate 2 can be prevented from being charged up and thus discharging, to provide for a significantly improved film-production yield. This may be because flexible spacer 5 between substrate 2 and back plate 3 can prevent substrate 2 from being damaged while it enables a planar contact rather than a point contact to be maintained between conductive layer 1 and substrate 2 and as a result the electric charge transferred from charged particles to the conductive layer on insulator substrate 2 can be released to the earth via conductive holder 1.

In accordance with the FIG. 2 method, glass substrate 2 with a TCO layer formed on the entirety of its lower surface was mounted on conductive holder 1 and an Ag layer was deposited on substrate 2 through sputtering. As a result it was found that the conductive layer on glass substrate 2 was not charged up and did not discharge.

Furthermore, it has been found that any discharge attributable to charge-up did not occur either when a glass substrate with a transparent electrode and a semiconductor layer successively stacked thereon was mounted on conductive holder 1 and then an Ag layer was deposited thereon through sputtering. As a principle of this effect, the following is considered other than the phenomena previously described. More specifically, owing to the planar contact between the conductive holder and the substrate, there may be continuity of the deposited conductive film between the conductive holder and the substrate and hence an electrical conduction therebetween. It may be evidence thereof that a conductive layer formed directly on an insulator substrate held on this holder was much less frequently charged up and discharged.

Figure 3:
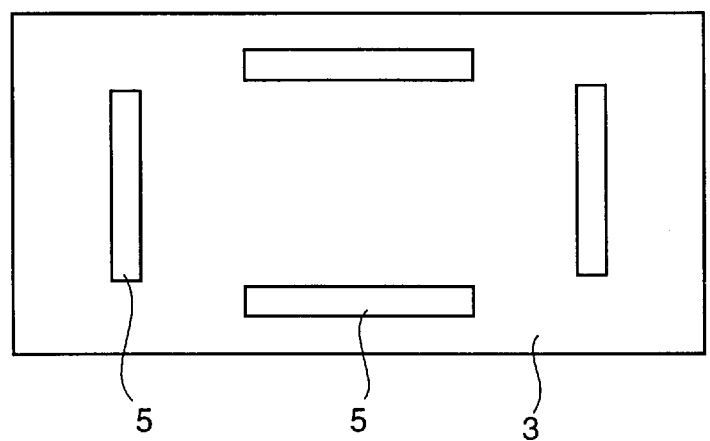
FIG. 3 is a schematic plan view showing an exemplary back plate that can be preferably used in the sputtering-deposition method shown in FIG. 2.

For the sputtering-deposition method as shown In FIG. 2, after insulator substrate 2 is positioned on the conductive holder's step 1b, separate flexible spacers may be arranged along the substrate's peripheral edge portion and back plate 3 may then be superposed thereon. To simplify the process, however, it is preferable that spacer 5 be previously fixed on back plate 3. FIG. 3 is a schematic plan view of back plate 3 with such spacer 5 previously arranged thereon, positioned as appropriate, and fixed thereto. It should be noted, however, that spacer 5 is not limited in size, shape or arrangement as shown in FIG. 3 and it can be selected as appropriate depending on the properties, size and shape of the substrate. Spacer 5 can be fixed to back plate 3 by means of an adhesive agent, screwing, welding and the like.

Thus the present invention can provide for a sputtering-deposition method capable of preventing a conductive layer from being charged up and thus discharging when a film including at least one such conductive layer is formed on an insulator substrate, realizing a significantly improved production yield.

Figure 4:
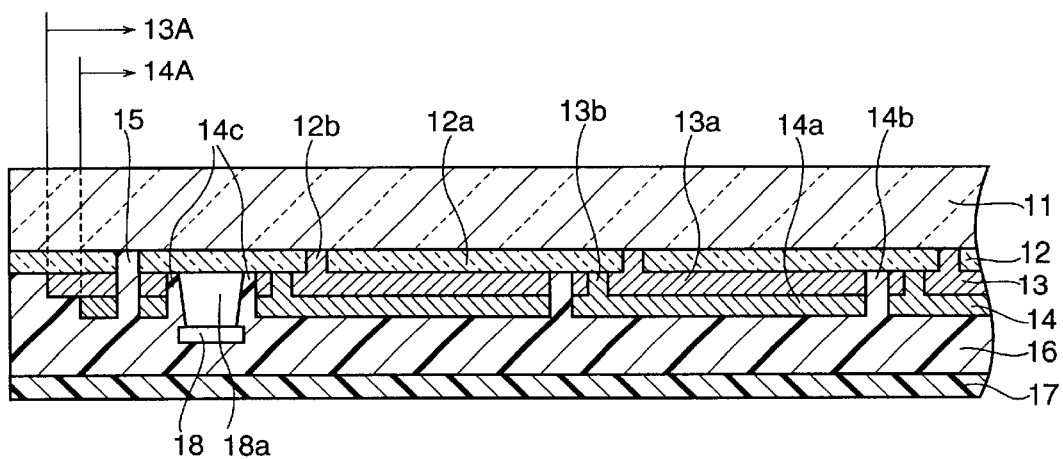
FIG. 4 is a schematic cross section of a thin-film solar battery module according to another embodiment of the present invention.

FIG. 4 is a schematic cross section of an integrated thin-film solar battery module according to another embodiment of the present invention. To fabricate this solar battery, initially on a soda-lime-glass substrate 11 having an area of 92 cm×46 cm and a thickness of 4 mm, a tin oxide film as a transparent electrode layer 12 having a thickness of approximately 800 nm was formed by thermal CVD (chemical vapor deposition). It should be noted that the tin oxide film may be replaced with another film of TCO such as ITO (indlium-tin oxide) or zinc oxide.

Transparent electrode layer 12 was then laser-scribed to form a plurality of transparent-electrode isolation grooves 12b to divide transparent at electrode layer 12 into a plurality of transparent electrode strips 12a extending in a direction orthogonal to the plane of FIG. 4. To laser-pattern the layer, glass substrate 11 was set on an X-Y table and a beam from a Q switch YAG laser was directed through substrate 11 and focused to irradiate transparent electrode layer 12. As a laser condition, the second harmonic having a wavelength of 532 nm was used, with a pulse frequency of 3 kHz, an average output of 500 mW, and a pulse width of 10 nsec. Each transparent electrode 12a formed was approximately 10 nm wide and each groove 12b was approximately 50 μm wide.

Then, plasma CVD was employed to deposit a semiconductor layer 13 on patterned transparent electrode layer 12 in a region 13A three millimeters inward of any perimeters of substrate 11. In this CVD, a substrates supporting frame was used to cover the substrate's peripheral edge portion by a width of 3 mm. Semiconductor layer 13 was formed of a p-type a-SiC:H (amorphous hydrogenated silicon carbide) sublayer, an i-type a-Si:H sublayer, and an n-type μc-Si:H (microcrystalline hydrogenated silicon) sub layer successively deposited to provide a p-i-n semiconductor junction. The p-, i- and n-type sublayers were each deposited in a separate chamber of an in-line type plasma CVD apparatus.

To deposit the p-type sublayer, $SiH_4$ at 100 sccm (standard cubic centimeter per minute), hydrogen at 200 sccm containing $B_2H_6$ of 1000 ppm, and $CH_4$ at 30 sccm were used with a pressure of 133 Pa (1 Torr) and a high-frequency source power of 200W applied. The p-type sublayer was deposited to have a thickness of approximately 15 nm. To deposit the i-type sublayer, $SiH_4$ at 500 sccm was used with a pressure of 67 Pa (0.5 Torr) and a source power of 500W applied. The i-type layer was deposited to have a thickness of approximately 320 nm. To deposit the n-type sublayer, $SiH_4$ at 100 sccm and hydrogen at 200 sccm containing $PH_3$ of 1000 ppm were used with a pressure of 133 Pa and a source power of 3 kW applied. The n-type layer was deposited to have a thickness of approximately 30 nm.

Then, semiconductor layer 13 was laser-scribed to form a plurality of semiconductor-layer division grooves 13b to divide the layer into a plurality of semiconductor regions 13a. The laser-scribing conditions in this case were the Fame as those in patterning transparent electrode layer 12, except that depth of focus the laser beam was changed. Each semiconductor-layer division groove 13b was 100 μm wide and spaced by 100 μm from transparent ant-electrode isolation groove 12b adjacent thereto.

Then, a zinc oxide film of 100 nm thickness and a silver film of 200 nm thickness were stacked as a back electrode layer 14 on patterned semiconductor layer 13a in a region 14A 4 mm inward of any perimeters of substrate 11. The zinc oxide film acts to maintain the silver film's high reflectance and also to prevent silver atoms from diffusing into semiconductor layer 13. As an alternative to the silver film, another film of a metal may be used such as Al, Cr, Ti or the like.

The zinc oxide film was deposited through magnetron sputtering. As the sputtering conditions, an argon gas pressure of 0.27 Pa (2 mTorr), a high-frequency source power of 200W and a deposition temperature of 200° C. were used. The silver film was also deposited through magnetron sputtering. The sputtering conditions used for the silver film was different from those utsed for the zinc oxide film only in that a direct-current power supply was used for the deposition at a room temperature.

Backs electrode layer 14 was laser-scribed to form a plurality of back-electrode isolation grooves 14b and thus it was divided into a plurality of back electrodes 14a. The laser-scribing conditions in this case were exactly the same as those for formation of semiconductor-layer division groove 13b, and together with a local region of semiconductor layer 13 having absorbed the laser beam, back electrode layer 14 thereon was locally brown away to form back-electrode isolation groove 14b each having a width of 70 μm and spaced by 100 μm from semiconductor-layer division groove 13b adjacet thereto.

After back electrode isolation groove 14b was formed, a bus bar electrode connection groove 14c was laser-scribed. While bus bar electrode connection region 14c in FIG. 4 is shown with semiconductor layer 13 and back electrode layer 14 both completely removed, it may be provided in a form of a baunch of multiple grooves, since a copper foil 18 as a bus bar electrode (can be connected later by solder 18a to transparent electrode 12a through the bunch of groove.

Figure 5:
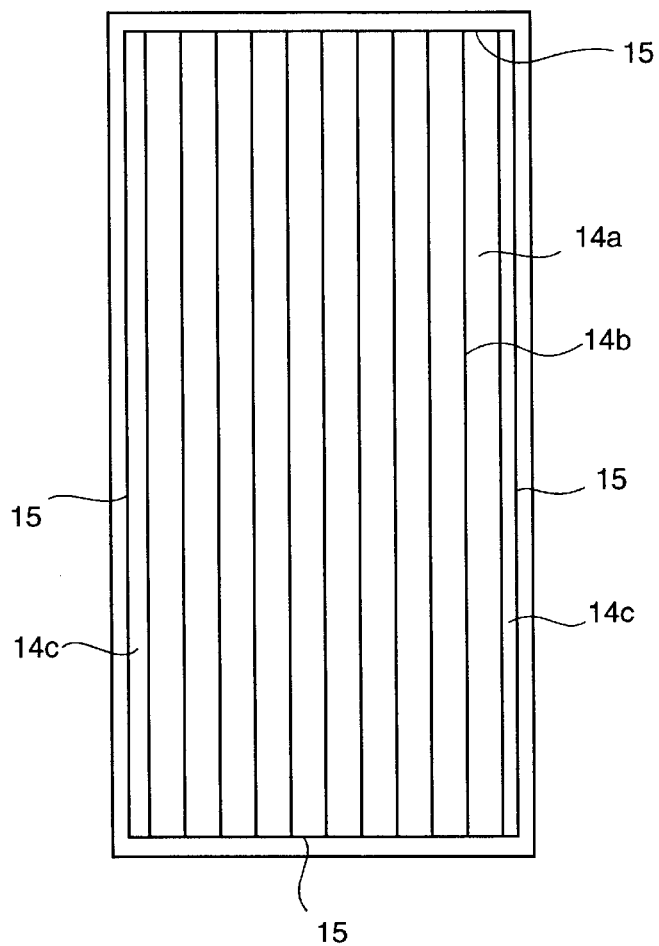
FIG. 5 is a schematic plan view showing a peripheral isolation groove in the FIG. 4 thin-film solar battery module.

Then, by laser-scribing similarly in forming transparent-electrode isolation groove 12b, a peripheral isolation groove 15 was formed 5 mm inward of the perimeter of substrate 11. Peripheral isolation groove 15 was formed to have a width of 150 μm and also penetrated transparent electrode layer 12, semiconductor layer 13 and back electrode layer 14. In FIG. 5, peripherel isolation groove 15 along the perimeter of substrate 11 is shown in a schematic plan view. While FIG. 5 shows a limited number of back electrodes 14a to simplify the drawing, in practice 50 back electrodes were included.

Copper foil electrode 18 was then joined by solder 18a to each of bus bar elect code connection regions 14c provided at opposite ends of the plurality of photoelectric conversion cells interconnected in series. Then, the photoelectric conversion cells were integrated and had their back surfaces protected by an EVA (ethylene-vinyleacetate copolymer) resin filler 16 and a fluroresin film 17. While typically an EVA resin is transparent and a fluororesin film is also transparent or has white color, the present invention employs those colored dark. More specifically, the present invention a dopts dark colors such as black, brown or wine red.

The obtained, integrated thin-film solar battery module was illuminatel by a solar simulator with a light of AM1.5 having an energy density of 100 mW/cm$^2$, and it exhibited photoelectric conversion characteristics of a short-circuit current of 1240 mA, an open-circuit voltage of 44.2V, a fill factor of 0.68, and a maximum output of 37.3W. In the present enibodiment, five integrated thin-film solar batteries were fabricated and they all presented generally similar photoelectric conversion characteristics.

Figure 6:
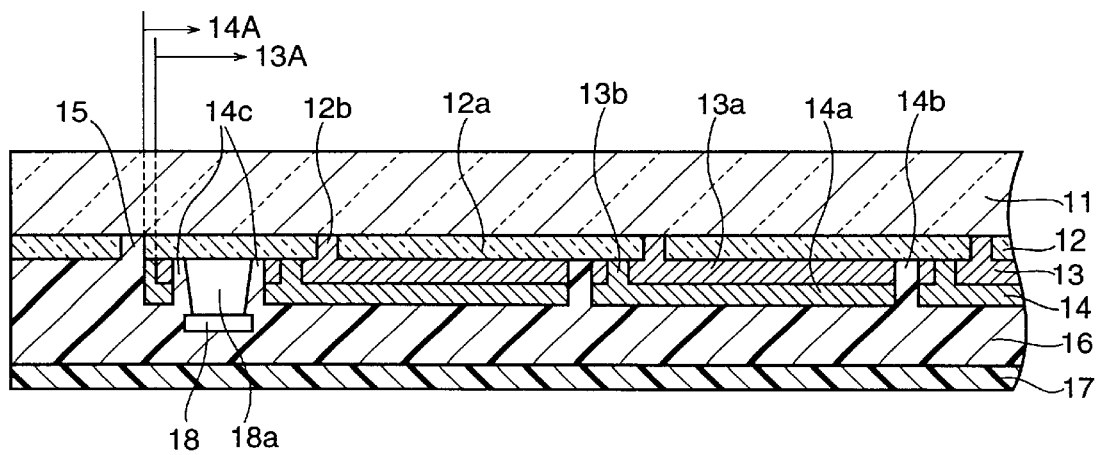
FIG. 6 is a cross section of a thin-film solar battery module as a comparative example with respect to the FIG. 4 embodiment.

As a comparattive example related to the FIG. 4 embodiment, an integrated thin-film solar battery was fabricated as shown in FIG. 6. The FIG. 6 solar battery is distinguished from the FIG. 4 solar battery only in that semiconductor layer 13 and back electrode layer 14 were deposited with a substrate supporting frame covering a peripheral edge of substrate 11 by a width of 5 mm. Five such comparati ve solar batteries were fabricated. Because of an unavoidable slight position offset between semiconductor layer deposition region 13A and back electrode layer deposition region 14A, back electrode layer 14 had a peripheral region protruding from at least one side of a rectangular outer periimeter of semiconductor layer deposition region 13A and thus observed as a thin white line. Furthermore, although three of the five solar batteries of FIG. 6 comparative example presented photoelectric conversion characteristics substantially equivalent to those of the FIG. 4 enmbodimet it, the remaining two solar batteries had faulty insulation with respect to peripheral isolation groove 15.

Thus in the present invention, the intefrated thin-film solar battery module can have an appearance with its surface uniformly having a dark browny color. Furthermore, insulation and separation between the cell formation region and the peripheral edge can be ensured without an additional fabrication step, to provide an increased production yield of such integrated thin-film solar battery modules.

Figure 7:
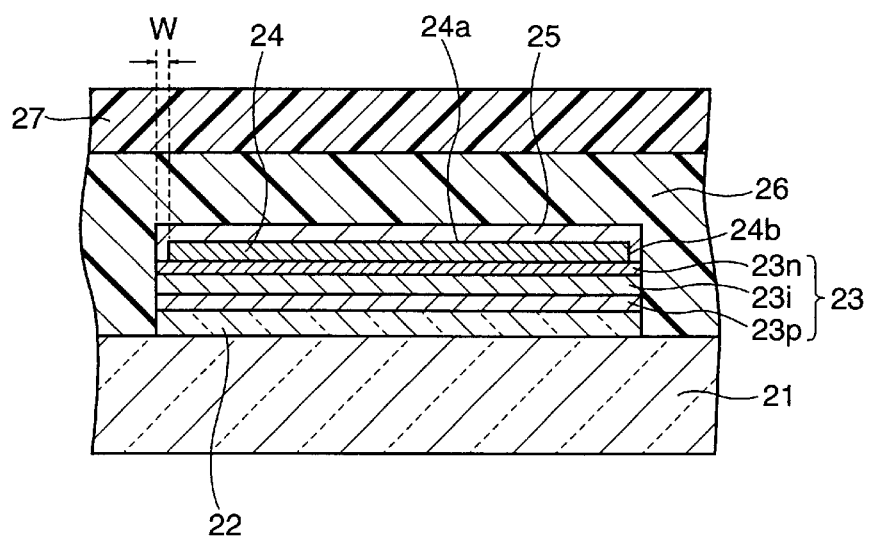
FIG. 7 is a schematic cross section showing a thin-film photoelectric conversion device according to still another embodiment of the present invention.

FIG. 7 is a schematic cross section of a semiconductor thin-film photoelectric conversion cell according to still another embodiment of the present invention. FIG. 7 shows only a single photoelectric conversion cell to simplify the drawing. It is needless to say, however, that this photoelectric conversion cell can also be applied to the integrated thin-film solar battery module as shown in FIG. 4.

In FIG. 7, the semiconductor thin-film photoelectric conversion cell may have a transparent substrate 21 formed of a glass plate, a transparent resin film or the like. Formed on transparent substrate 21 is a transparent electrode 22 of tin oxide, ITO, zinc oxide or the like. Transparent electrode 21 may have a monolayered structure or a multilayered structure formed of TCO of different kinds and can be formed through a known vapor phase deposition such as evaporation, chemical vapor deposition, sputtering or the like.

Preferably, transparent electrode layer 22 has a surface having a textured surface structure with fine unevenness. Such a textured surface structure of transparent electrode layer 22 can act to scatter and introduce light into a semiconductor thin-film photoelectric conversion unit 23 fabricated thereon, to contribute to providing an improved photoelectric conversion efficiency.

Typically, as shown in FIG. 7, semiconductor thin-film photoelectric conversion unit 23 formed on transparent electrode layer 22 includes a p-type semconductor layer 23$p$, an i-type semiconductor photoelectric conversion layer 23$i$ and an n-type semiconductor layer 23$n$, all of which semiconductor layers can be deposited by plasma CVD.

P-type semiconductor layer 23$p$ can be formed of silicon or silicon carbide and is doped with atoms of a p-type conductivity-type determining dopant such as boron or aluminum. Photoelectric conversion layer 23$i$ on p-type semiconductor layer 23$p$, can be formed of substantially intrinsic semiconductor, such as silicon, silicon carbide, silicon germanium or the like. Photoelectric conversion layer 23$i$ may also be formed of a weak p- or n-type semiconductor material containing a slight amount of conductivity-type determining dopant atoms, as long as the resulting layer has a sufficient photoelectric conversion capability. Photoelectric conversion layer 23$i$ is typically formed to have a thickness in a range of 0.1 to 10 $\mu$m.

N-tape semiconductor layer 23$n$ on photoelectric conversion layer 23$i$, can be formed of silicon or silicon germanium and is doped with atoms of an n-type conductivity-type determining dopant, such as phosphorus or arsenic.

A silver-containing back electrode layer 24 on photoelectric conversion unit 23, not only functions as an electrode but reflects light transmitted through photoelectric conversion unit 23 back to the unit. Back electrode layer 24 can be formed of silver or a silver alloy, though it is typically formed of silver in view of high reflectance and conductivity. Between back electrode layer 24 and photoelectric conversion layer 23 there may be provided a thin TCO layer such as zinc oxide. Such TCO layer can act to prevent back electrode layer 24 from having a degraded light reflectance and also to prevent silver atoms from diffusing into photoelectric conversion unit 23. Back electrode 24 can be formed through evaporation, sputtering or the like.

Back electrode layer 24 has not its upper surface 24$a$ but side surface 24$b$ covered with an inorganic protection film 25, as an essential feature of the present invention. More specifically, inorganic protection film 25 is formed to have a structure capping back electrode 24.

Inorganic protection layer 25 is formed of an inorganic material stable agrinst air and water, e.g., a noble metal such as gold or platinum, a base metad forming a passive-state film in the atmosphere such as aluminum or titanium, or an oxide such as silicon oxide, aluminum oxide or zinc oxide, and it may have a monolayered structure or a multilayered structure. Such inorganic materials can also have a superior adhesiveness with sealing resin 26 provided thereon. Of the inorganic materials, titanium can be particularly preferably used as inorganic protection film 25 because of its ability to prevent degradation of silver-containing back electrode layer 24 and its adherence to sealing resin 26.

Inorganic protection layer 25 can be deposited through evaporation, sputtering, chemical vapor deposition or the like. Inorganic protection film 25 has a thickness set in a range of 0.5 to 100 nm, preferably 2 to 10 nm.

As h as been described previously, inorganic protection film 25 covers and thus isolates upper and side surfaces 24$a$ and 24$b$ of silver-containing back electrc de layer 24 from the external environment. While back electrode layer 24 may cover the upper surface of photoelectric conversion unit 23 entirely, preferably back electrode layer 24 has a peripheral edge slightly inward of a peripheral edge of photoelectric conversion unit 23, as shown in FIG. 7. In other words, photoelectric conversion unit 23 preferably has an upper surface with a peripheral edge region slightly protruding from the peripheral edge of back electrode layer 24. As such, inorganic protection film 25 can not only cover upper and side surfaces 24a and 24b of back electrode 24 but be joined to the upper peripheral edge region of photoelectic conversion unit 23 to more reliably seal and hence protect back electrode 24. It should be noted that such upper peripheral exposed region of photoelectric conversion unit 23 is only desired to have a width W equivaleni to the thickness of inorganic protection layer 25.

The photoelectric conversion cell, with silver-containing back electrode layer 24 having both upper and side surfaces 24a and 24b covered with inorganic protection film 25 of titanium or the like, ensures that back electrode layer 24 is prevented from deteriorating in subsequent fabrication steps. As such, without applying sealing resin layer 26 and organic protection film 27 immediately after formation of inorganic protection film 25, a photoelectric conversion cell can be stored in the atmosphere and thus suffer less constraints during its fabrication process.

Sealing resin layer 26 applied onto inorganic protection film 25 can be a type of resin capable of sealing the photoelectric conversion cells and adhering to organic protection film 27. Such sealing resin 26 may be thermoplastic resin, thermosetting resin or photocuring resin, and more specifically it can be EVA (ethylenevinylacetate copolymer), PVB (polyvinyl butyral), PIB (polyisobutylene), silicon resin or the like.

Organic protection film 27 may include at least one insulator film highly resistant to moisture and water, e.g., a fluororesin film such as polyvinyl fluoride (e.g., Tedler® film), or PET (poly ethylene terephthalate film. Orgaaic protection film 27 may also have a laminated structure sandwiching a metal foil formed, e.g., of aluminum, since such a foil acts to enhance moisture resistance, water resistance and the like and thus more effectively protects the photoelectric conversion cells from moisture.

The sealing resin 26 and organic protection film 27 as described above can be joined simultaneously to the back surfaces of the photoelectric conversion cells through vacuum lamination. Since inorganic protection film 25 itself is stable against air and water, its initial adherence to sealing resin 26 is sufficient. As such if an integrated thin-film solar battery module including a plurality of the FIG. 7 photoelectric conversion cells is used outdoor for a long time period, the photoelectric conversion cells can be reliably protected by sealing resin 26 and organic protection film 27.

It should be noted that degradation of silver-containing back electrode 24 can be detected by x-ray analysis (x-ray photoelectron spectroscopy) of silver sulfide and that the adherence of sealing resin 26 and organic protection film 27 to inorganic protection film 25 can be known by measuring, the force required for peeling organic protection film 27 from an end of the back surface of the photoelectric conversion device.

Description will now be made of a more specific example corresponding to the FIG. 7 embodiment and comparative examples associate therewith.

SPECIFIC EXAMPLE

A integrated thin-film solar battery module including a plurality of the FIG. 7 photoelectric conversion cells was fabricated as described below. Initially, a glass substrate 21 was prepared, having a major surface on which a $SiO_2$ layer (not shown) of 50 nm thickness was formed. Deposited on the $SiO_2$ layer was a tin oxide film 22 having an uneven surface texture, F-doped, and having a thickness of approximately 800 nm. Tin oxide film 22 was laser-scribed and thus patterned in a plurality of transparent electrodes.

Then, plasma CVD was carried out to successively deposit on tin oxide filin 22 a p-type a-SiC: H layer 23n of 15 nm thickness, an i-type a-Si: H layer 23i of 400 nm thickness, and an n-type μc-Si: H layer 23n of 30 nm thickness. P-type n-SiC: H layer 23n was doped with boron, i-type a-Si: H layer 23i is non-doped, and n-type μc-Si:H layer 23n was doped with phosphorus. Thus, photoelectric conversion ullit 23 was obtained including a p-i-n junction.

After thin-film photoelectric conversion unit layer 23 was laser-scribed and thus patterned, an in-line type magnetron sputtering apparatus was used to successively deposit a zinc oxide layer (not shown) of 80 nm in thickness and a silver electrode layer 24 of 200 nm thickness. The zinc oxide layer aLnd silver electrode layer 24 were deposited using a mask having an opening slightly smaller than the region of each photoelectric conversion unit 23.

Then, by using a mask having a slightly larger opening than the mask used lor deposition of each silver electrode 24, sputtering was carried out to form a titanium layer 25 having a thickness of 5 nm to cover the silver electrode's upper and side surfaces 24a and 24b. It should be noted that the mask used for deposition of each silver electrode 24 can also be used to deposit titanium layer 25. More specifically, by placing the mask slightly farther froimi substrate 21 in depositing titanium film 25 than in depositing silver electrode 24, titanium atoms can travel around a peripheral edge of the mask's opening to cover the silver electrode's side surface 24b.

An integrated thin-film solar battery was thus fabricated with a plurality of photoelectric conversion cells interconnected in series as shown in FIG. 4 and the battery was left in the atmosphere for no less than 200 hours. Then, silver electrode layer 24 was subjected to x-ray analysis and any silver sulfide was not detected nor did the layer's surface have any change in color observed.

Then, Tedler® film 27 was stuck onto titanium layer 25 with EVA filler resin 26 therebetween to obtain the photoelectric conversion device as shown in FIG. 7.

Comparative Example 1

An integrated thin-film solar battery module similar to the above specific example was fabricated except that titanium that protection film 25 was not provided. More specifically, after silver electrode layer 24 was formed, the layer was left for one hour in the atmosphere and then covered with EVA resin filler 26 and Tedler® film 27.

Comparative Example 2

An integrated thin-film solar battery module of comparative example 2 was fabricated similar to that of comparative example 1, except that it is left, in the atmosphere for 12 hours after formation of silver electrode layer 24. In this comparative example, after the exposure to air for 12 hours, silver electrode layer 24 was found through visual observation to have a surface changed in color, yellowish. Furthermore, silver electrode layer 24 was subjected to x-ray analysis, and silver electrode layer 24 exposed to air for a shorter time period had silver sulfide detected only at its surface and silver electrode layer 24 exposed to air for a longer time period had silver sulfide also detected at its deeper portion.

Comparative Example 3

An integrated thin-film solar battery module of comparative example 3 was fabricated similar to the above specific example, except that the silver electrode's upper surface 24a was covered with protection film 25 of titanium whereas its side surface 24b was not. After titanium protection film 25 was provided only on the silver electrode layer's upper surface 24a, the module was exposed to air for 200 hours and silver electrode layer 24 was then subjected to x-ray analysis. Silver electrode 24 had a small amount of silver sulfide detected at a peripheral edge thereof.

The integrated thin-film solar battery modules of the specific example and comparative examples 1–3 thus fabricated were measured for the adhesive strength between EVA layer 26 and Tedler® film 27. More specifically, measured as the adhesive strength therebetween was a force required per unit width for partially peeling EVA layer 26 and Tedler® film 27 from silver electrode layer 24 or titanium protection layer 25 and continuing such peeling.

As a result it has been found that the measured adhesive strength at a center of silver electrode 24 was approximately 5 kgf/cm in comparative example 1, but was reduced to approximately 0.7 kgf/cm in comparative example 2. In other words, it has been found that a conventional thin-film photoelectric conversion device with a silver electrode layer exposed to air for a simply Lncreased time period from 1 hour to 12 hours has a significantly reduced adhesive strength of sealing resin layer 26 and Tedler® film 27.

In comparative example 3, an adhesive strength of approximately 5 kgf/cm could be obtained at a center but could not at a periphery of titanium protection film 25.

In the specific example, in contrast, even with titanium protection film 25 exposed to air for a long time period exceeding 200 hours, EVA layer 26 and Tedler® film 27 had an adhesive strength of no less than approximately 5 kgf/cm at a center of titanium protection film 25 and they also had at a peripheral edge of titanium protection film 25 an adhesive strength equivalent to that obtained at the center of titanium protection film 25.

Thus, it has been confirmed that the thin-film photoelectric conversion device of the specific example can maintain a sufficiently high adhesive strength of EVA layer 26 and Tedler® film 27 with respect to titanium protection layer 25 over an extremely long time period, and thus prevent degradation of silver electrode layer 24.

As such the present invention can provide a highly reliable thin-film photoelectric conversion device with a silver-containing back electrode layer having not only its upper surface but also side surface covered with an inorganic protection film stable against air and water to prevent degradation of the silver-containing back electrode layer.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An integrated thin-film solar battery, including:

a stacked-layered body comprised of a transparent electrode layer, a semiconductor layer and a back metal electrode layer successively deposited on a transparent insulator substrate, wherein the stacked-layered body is divided by a peripheral isolation groove that extends through the stacked-layered body to isolate a peripheral region from a photoelectric conversion cell region in which a plurality of electrically interconnected photoelectric conversion cells are formed, and wherein a whole outer peripheral edge of the back metal electrode layer is slightly inward of a whole outer peripheral edge of the semiconductor layer in said peripheral region.

2. The solar battery of claim 1, wherein said plurality of photoelectric conversion cells are formed in a region within said back metal electrode layer's region.

3. The solar battery of claim 1, wherein a back sealing resin filler or an organic back protection film having a dark color selected from the group consisting of black, brown and wine red is provided to protect said transparent electrode layer, said semiconductor layer and said back metal electrode layer.

4. The solar battery of claim 1, wherein said semiconductor layer contains silicon as a main component.

5. The solar battery of claim 1, wherein the whole outer peripheral edge of the back metal electrode layer is inwardly offset with respect to the outer peripheral edge of the semiconductor layer in said peripheral region such that the outer peripheral edge of the semiconductor layer overlaps the outer peripheral edge of the back metal electrode layer.

* * * * *